United States Patent [19]

Gunter et al.

[11] Patent Number: 5,534,819

[45] Date of Patent: Jul. 9, 1996

[54] CIRCUIT AND METHOD FOR REDUCING VOLTAGE ERROR WHEN CHARGING AND DISCHARGING A VARIABLE CAPACITOR THROUGH A SWITCH

[75] Inventors: Brad D. Gunter, Phoenix; David Anderson, Scottsdale; Danny A. Bersch, Gilbert; Howard C. Anderson, Tempe; Doug Garrity, Gilbert, all of Ariz.

[73] Assignee: Motorola, Inc., Schaumburg, Ill.

[21] Appl. No.: 421,721

[22] Filed: Apr. 13, 1995

[51] Int. Cl.[6] .............................. H03B 1/00; H03K 17/16
[52] U.S. Cl. .................... 327/553; 327/554; 327/379; 327/391
[58] Field of Search ....................... 327/108, 111, 327/337, 379, 391, 393, 394, 395, 553, 554, 278, 281; 333/173

[56] References Cited

U.S. PATENT DOCUMENTS

| | | | |
|---|---|---|---|
| 4,322,697 | 3/1982 | Carbrey | 333/173 |
| 4,814,640 | 3/1989 | Miyake | 327/337 |
| 5,440,260 | 8/1995 | Hayashi et al. | 327/278 |

OTHER PUBLICATIONS

Authors Roubik Gregorian and Gabor C. Temes, "Analog MOS Integrated Circuits for Signal Processing", chapter 7, p. 467 equation 7.10.

*Primary Examiner*—David C. Nelms
*Assistant Examiner*—Trong Phan
*Attorney, Agent, or Firm*—Gary W. Hoshizaki

[57] ABSTRACT

A circuit and method for reducing voltage error when charging and discharging a variable capacitor (44) through a switch (43). The switch (43) comprises a plurality of transmission gates (53–55) coupled in parallel. A control circuit (42) provides control signals for enabling transmission gates of the plurality of transmission gates (53–55). The control circuit (42) changes the resistance of the switch (43) by selecting an appropriate transmission gate wherein each transmission gate has a different resistance. The resistance of the switch (43) is varied as a capacitance of the variable capacitor (44) is changed to maintain a predetermined RC time constant over the entire range of capacitor values of the variable capacitor (44).

8 Claims, 2 Drawing Sheets

CIRCUIT AND METHOD FOR REDUCING VOLTAGE ERROR WHEN CHARGING AND DISCHARGING A VARIABLE CAPACITOR THROUGH A SWITCH

BACKGROUND OF THE INVENTION

This invention relates, in general, to switched capacitor circuits, and more particularly, to reducing voltage error when charging and discharging a variable capacitor through a switch.

The use of programmable capacitor arrays are prevalent in many different types of circuits. For example, switched capacitor circuits and field programmable analog circuits represent different types of circuits utilizing a variable (or programmable) capacitor. In either case, a programmable capacitor array allows a circuit to vary its characteristics dynamically by changing the capacitance of the variable capacitor.

A capacitor is typically used as an element to store charge. In an integrated circuit, charge is coupled to a capacitor through a switch. A common integrated switch is known as a transmission gate. A transmission gate has several properties that make it a non-ideal switch. A first property is that it has a finite resistance when enabled. The finite resistance of the transmission gate and the capacitor to which it couples forms a RC time constant (R=resistance of the transmission gate and C=capacitance of the capacitor). A second property is that a transmission gate has parasitic capacitance and channel charge which couples to the capacitor. The parasitic capacitance and channel charge produces a voltage error when the transmission gate is turned on and off.

Switch design for charging and discharging a capacitor must be well thought out to meet the accuracy and speed requirements of a circuit in which the switch design is incorporated. In general, the RC time constant of a transmission gate and capacitor is selected such that the capacitor charges and discharges within a predetermined percentage of an applied voltage within a specified time period. A transmission gate operated at high speeds (short time period for charging and discharging a capacitor) has a low resistance to insure a voltage stored on a capacitor approximates an applied voltage to the transmission gate. A low resistance corresponds to a large transmission gate. Charge cancelling circuitry is employed to negate effects due to parasitic capacitance and channel charge of a transmission gate.

A programmable or variable capacitor is programmable for a wide range of capacitor values. A transmission gate coupled to a variable capacitor cannot meet all performance criteria over the entire capacitance range of the variable capacitor due to either its channel resistance or parasitic capacitance. For example, a transmission gate comprising large geometry transistors has a low on-resistance and will meet speed requirements over the entire capacitance range of a variable capacitor but will also have large parasitic capacitance values. Significant voltage error could be introduced to a variable capacitor providing a small capacitance value if the charge injected through the large parasitic capacitance of the transmission gate is not completely negated. Conversely, a smaller transmission gate would not meet speed and accuracy requirements at large capacitance values of a variable capacitor since it would take an increased time to charge and discharge the large capacitance through a high resistance switch.

It would be of great benefit if a circuit could be provided that allows a transmission gate coupled to a variable capacitor to meet speed and accuracy requirements over the entire capacitance range of a variable capacitor.

DETAILED DESCRIPTION OF THE DRAWINGS

Ideally, a switch instantaneously couples a first circuit to a second circuit without any deleterious results. In an integrated circuit, switches are formed from transistors. For example, in a Complementary Metal Oxide Semiconductor (CMOS) process flow, n and p-channel enhancement MOSFETs (Metal Oxide Semiconductor Field Effect Transistors) are used to form a switch. The n-channel and p-channel transistors are often used separately to form a switch but the most prevalent configuration is to use both n-channel and p-channel transistors to form a circuit known as a transmission gate.

The transmission gate is a non-ideal switch. An enabled transistor has a finite resistance that impacts the speed at which a switch operates. A transistor also has parasitic capacitance that couples between a gate and drain (or source) of the device. The parasitic capacitance is a current path for providing and receiving charge as the transmission gate is enabled and disabled. Furthermore, a MOSFET transistor is a surface device having a conductive channel formed when a bias voltage is applied to a gate of the MOSFET transistor. Charge associated with the conductive channel must exit the transmission gate when it is disabled.

Figure 1:
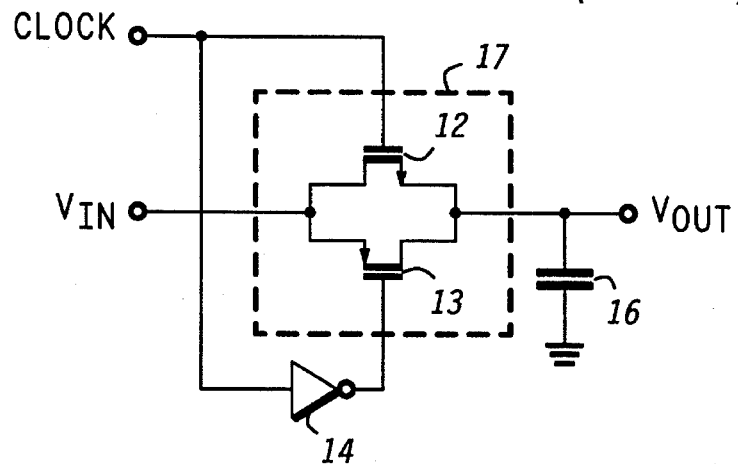
FIG. 1 is a prior art illustration of a transmission gate coupled to a capacitor.

FIG. 1 is a prior art schematic of a switched capacitor network 11 comprising a transmission gate 17 and a capacitor 16. Transmission gate 17 is a switch for coupling a voltage applied to an input VIN to an output VOUT. Transmission gate 17 comprises an n-channel 12 and a p-channel 13 enhancement MOSFET. N-channel enhancement MOSFET 12 has a drain coupled to VIN, a gate coupled to a CLOCK input, and a source coupled to VOUT. P-channel enhancement MOSFET 13 has a drain coupled to VOUT, a gate, and a source coupled to VIN. An inverter 14 provides an inverted clock signal to the gate of p-channel enhancement MOSFET 13. Inverter 14 has an input coupled to CLOCK and an output coupled to the gate of p-channel enhancement MOSFET 13. A capacitor 16 is coupled between VOUT and a power supply terminal (e.g. ground). Capacitor 16 stores a voltage coupled from VIN to VOUT through transmission gate 17 after transmission gate 17 is disabled.

The speed at which capacitor 16 is charged and discharged depending on the resistance of transmission gate 17 and a capacitance value of capacitor 16. The accuracy in which the output voltage at VOUT matches the input voltage applied to VIN is also a function of a RC time constant (R=resistance of transmission gate 17 and C=capacitance of capacitor 16) of switched capacitor network 11. A great deal has been written on the RC time constant required to meet timing and accuracy constraints of a switched capacitor network. In general, a RC time constant as shown below in equation (1) will satisfy most switched capacitor networks for speed and voltage accuracy.

$$R*C \leq (\text{Clock Period})/20 \qquad (1)$$

Transient phenomenon such as enabling and disabling the transmission gate adds additional error to the output voltage at VOUT. Parasitic capacitance from the gate to source of n-channel enhancement MOSFET transistor 12 and the gate to drain capacitance of p-channel enhancement MOSFET transistor 12 inject or pull charge from capacitor 16 as the clock signal transitions. Charge which forms the channel of the enabled n-channel and p-channel enhancement MOSFETs 12 and 13 is discharged through the input and output of transmission gate 17 when transmission gate 17 transitions from an on state to an off state. Both the charge exiting the output of transmission gate 17 due to the channel and transient coupling through parasitic capacitances produces an error voltage on capacitor 16.

Figure 2:
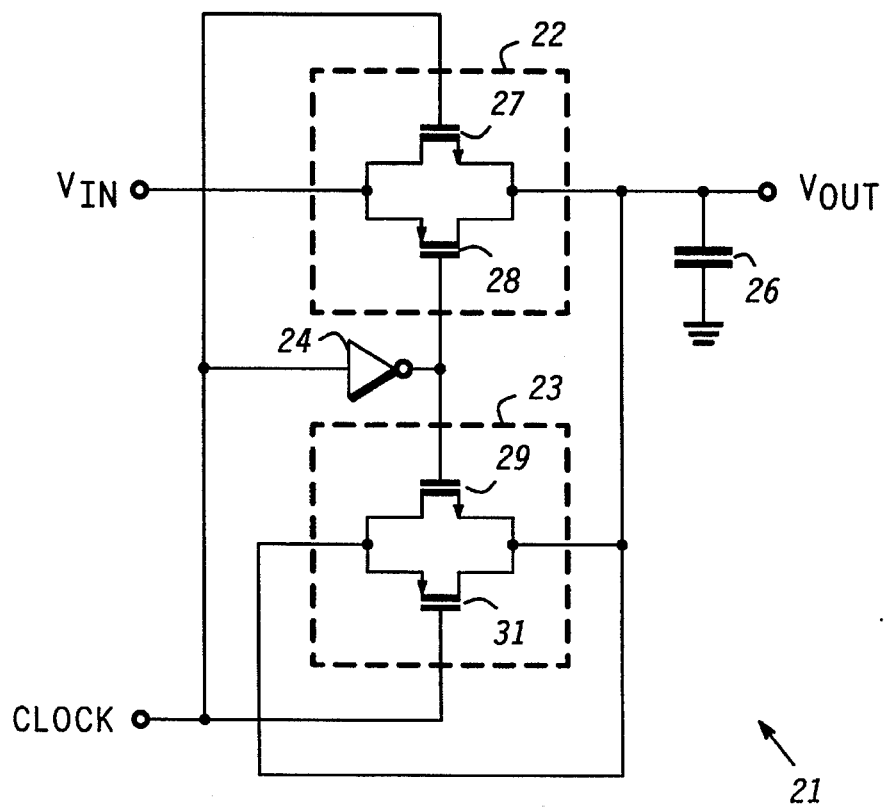
FIG. 2 is a prior art illustration of a transmission gate coupled to a capacitor including a second transmission gate for canceling switch induced voltage error.

FIG. 2 is a prior art schematic of a switched capacitor network 21 having a transmission gate 23 for cancelling out transient phenomenon when a transmission gate 22 is enabled and disabled. Transmission gate 22 is a switch for coupling a voltage applied to an input VIN to an output VOUT. Transmission gate 22 comprises an n-channel 27 and a p-channel 28 enhancement MOSFET. N-channel enhancement MOSFET 27 has a drain coupled to VIN, a gate coupled to a CLOCK input, and a source coupled to VOUT. P-channel enhancement MOSFET 28 has a drain coupled to VOUT, a gate, and a source coupled to VIN. An inverter 24 provides an inverted clock signal to p-channel enhancement MOSFET 28. Inverter 24 has an input coupled to CLOCK and an output coupled to the gate of p-channel enhancement MOSFET 28. A capacitor 26 stores a voltage coupled through transmission gate 22 to VOUT.

Transmission gate 23 is added to switched capacitor network 21 to negate charge injection to or from capacitor 26 from transmission gate 22 during a clock transition. The principal behind transmission gate 23 is to provide an equivalent device that undergoes an opposite transition such that any charge injected to capacitor 26 is also injected out of capacitor 26 or vice versa. The channel charge is compensated for by turning on transmission gate 23 (to form a channel in each transistor) when transmission gate 22 is turned off thereby receiving channel charge from transmission gate 22. In the preferred embodiment, transmission gate 23 has transistors having geometries one half the size of the transistors of transmission gate 22 which is compensated for by tying both the input and output of transmission gate 23 to VOUT.

A variable capacitor is employed in a switched capacitor application when characteristics of a circuit need to be altered or modified electronically. For example, a switched capacitor filter having a variable frequency range is accomplished by utilizing a variable capacitor. In an integrated circuit, a variable or programmable capacitor is formed by a group of capacitors that are coupled in series or parallel via switches. In the preferred embodiment, capacitors are coupled in parallel, each capacitor includes a series switch such that each capacitor is added or deleted.

An accuracy and speed problem occurs when charging and discharging a variable capacitor through a transmission gate. The transmission gate has a resistance value that is fixed for the entire range of capacitance values of the variable capacitor. A logical selection for a resistive value for the transmission gate is to select a midrange capacitance value of the variable capacitance and build a transmission gate according to equation (1) described hereinabove.

An accuracy problem occurs at small capacitance values of the variable capacitor. Speed is not an issue since a low resistance of the transmission gate rapidly charges and discharges a small capacitive value of the variable capacitor. The transmission gate is too large for the small capacitance values of the variable capacitor due to charge injection and channel charge. The transmission gate has larger parasitic capacitance and more channel charge than an ideal size transmission gate for the small capacitance values. Employing a voltage error cancelling transmission gate would reduce error but will not completely eliminate error since the transmission gates cannot not be perfectly matched. The absolute magnitude of a voltage error (induced on the small capacitance value) due to mismatched transmission gates is larger for a large transmission gate than a small transmission gate. Thus, a larger than optimal transmission gate increases the voltage error when charging and discharging a small capacitance value of a variable capacitor.

A speed and accuracy problem occurs at large capacitance values of the variable capacitor. The resistance of the transmission gate is not optimal for rapidly charging and discharging the large capacitance at high speeds. The resistance of the transmission gate could significantly slow down the speed at which the variable capacitor is operated. The accuracy of a final voltage is a function of a number of RC time constants (R=resistance of transmission gate and C=capacitance of the variable capacitor) during a charging period. It should be clear that selecting transmission gate characteristics for a specific capacitance value of a variable capacitor leads to voltage error on the variable capacitor at other capacitance values.

Figure 3:
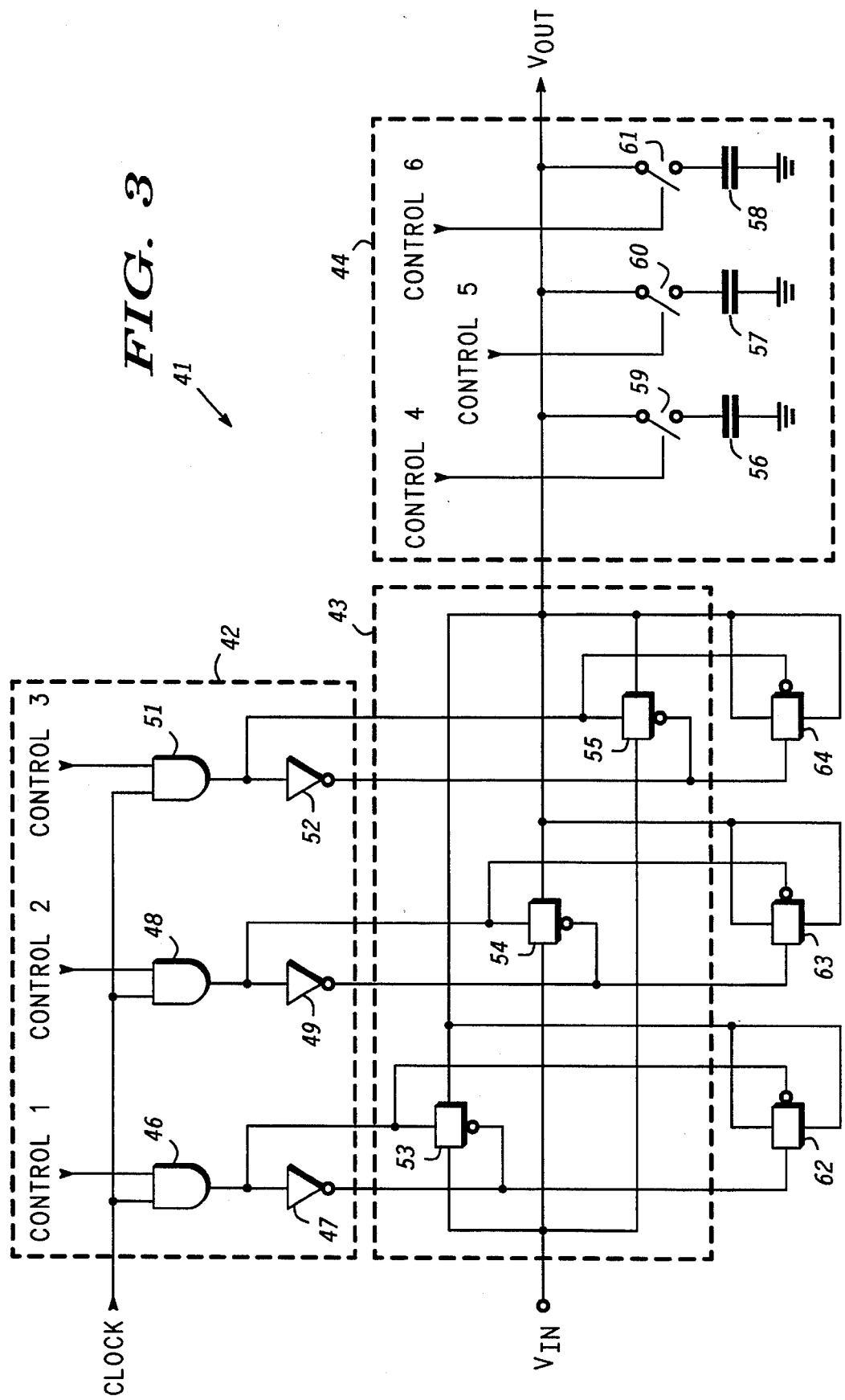
FIG. 3 is a schematic diagram of a control logic circuit coupled to a transmission gate for reducing voltage error when charging and discharging a variable capacitor in accordance with the present invention.

A method for reducing voltage error associated with a switch and a variable capacitor is to change or modify a resistance of a switch or transmission gate such that for each capacitance value of the variable capacitor the transmission gate has a resistance that approximately meets a predetermined time constant as described in equation (1). A schematic diagram of a switched capacitor network 41 that varies a resistance of a transmission gate 43 to maintain a predetermined RC time constant is illustrated in FIG. 3. Switched capacitor network 41 comprises a control circuit 42, transmission gate 43, and variable capacitor 44. A voltage applied to an input VIN is coupled through transmission gate 43 to variable capacitor 44. Ideally, a voltage at an output VOUT is identical (and stored by variable capacitor 44) to the applied voltage at VIN after transmission gate 43 is disabled.

In the preferred embodiment, transmission gate 43 comprises a plurality of transmission gates 53–55 coupled in parallel to one another. Transmission gates 53, 54, and 55 each comprise an n-channel and a p-channel enhancement MOSFET. The n-channel enhancement MOSFETs of transmission gates 53–55 each have a drain and source respectively coupled to VIN and VOUT. The p-channel enhancement MOSFETs of transmission gates 53–55 each have a drain and a source respectively coupled to VOUT and VIN. A gate of each n-channel and p-channel transistor of transmission gates 53–55 are coupled for receiving control signals from control circuit 42.

Voltage errors of transmission gate 43 due to parasitic capacitance and channel charge is negated by transmission gates 62–64 which respectively correspond to transmission gates 53–55. In the preferred embodiment, each of transmission gates 62–64 comprises an n-channel and a p-channel enhancement MOSFET having a geometry size, one-half that of its corresponding transmission gates (53–54). The n-channel enhancement MOSFETs of transmission gates 62–64 each have a drain and a source coupled to VOUT and a gate respectively coupled to the gate of the p-channel enhancement MOSFET of transmission gates 53–55. The p-channel enhancement MOSFETs of transmission gates 62–64 each have a drain and a source coupled to VOUT and a gate respectively coupled to the gate of the n-channel enhancement MOSFETs of transmission gates 53–55. The gate of each n-channel and p-channel enhancement MOSFET of transmission gates 62–64 is coupled for receiving a control signal from control circuit 42. Transmission gates 62–64 are enabled and disabled oppositely from its corresponding transmission gate 53–55. For example, transmission gate 62 is enabled as transmission gate 53 is disabled, or vice versa.

Variable capacitor 44 comprises a plurality of capacitors 56–58 that are coupled in parallel to one another via switches 59–61. Switches 59–61 respectively correspond to capacitors 56–58. Capacitors 56–58 are coupled between a corresponding switch and ground. Switches 59–61 each have a first terminal coupled to VOUT and a second terminal respectively coupled to a terminal of capacitors 56–58. Switches 59–61 are independently enabled and disabled by signals applied to inputs CONTROL4, CONTROL5, and CONTROL6. Although only three capacitors are shown for brevity it should be obvious that variable capacitor 44 could comprise significantly more capacitors to increase the range of capacitance it offers.

Control circuit 42 provides control signals for enabling and disabling transmission gates 53–55. Control circuit 42 couples and decouples a voltage applied to VIN to VOUT to charge and discharge variable capacitor 44. Control circuit 42 also enables transmission gate 43 for providing a transmission gate impedance that maintains a predetermined RC time constant (R=resistance of transmission gate 43 and C=capacitance of variable capacitor 44). Control circuit 42 comprises AND gates 46, 48, and 51, and inverters 47, 49, and 52.

AND gates 46, 48, and 51 each have a first input coupled to an input CLOCK, a second input respectively coupled to inputs CONTROL1, CONTROL2, and CONTROL3, and an output respectively coupled the gate of the n-channel enhancement MOSFET of transmission gates 53–55. Inverters 47, 49, and 52 each have an input respectively coupled to AND gates 46, 48, and 51 and an output respectively coupled to the gate of the p-channel enhancement MOSFET of transmission gates 53–55.

In the preferred embodiment, each transmission gate of transmission gate 43 corresponds to a capacitor of variable capacitor 44. For example, transmission gates 53, 54, and 55 respectively correspond to capacitors 56, 57, and 58. The geometries of the n and p-channel enhancement transistors which comprise each transmission gate of transmission gate 43 are selected to provide an impedance that generates a predetermined RC time constant with its corresponding capacitor of variable capacitor 44 as described in equation (1). Each transmission gate and capacitor pair has approximately the same predetermined RC time constant.

An alternative approach that would reduce the number of transmission gates required when a variable capacitor has a wide range of capacitance values is to enable more than one transmission gate to generate an effective resistance (the combined resistance of the enabled transmission gates in parallel) that meets a predetermined RC time for a particular value of capacitance of the variable capacitor.

In the preferred embodiment, only one capacitor of variable capacitor 44 is enabled at any time. A corresponding transmission gate of transmission gate 43 is enabled for coupling VIN to VOUT. Having a transmission gate tailored for each capacitor of variable capacitor 44 minimizes voltage error and maximizes speed for each capacitor value. Voltage error due to parasitic capacitance and transistor channel charge is further minimized by the charge negating transmission gates (62–64) coupled to the selected transmission gate of transmission gate 43. Moreover, a speed and voltage accuracy requirement for switched capacitor network 41 is assured since each transmission gate and capacitor combination meets the predetermined RC time constant.

Control signals applied to inputs CONTROL1–3 enable the transmission gate corresponding to a selected capacitor of variable capacitor 44. A clock signal is also applied to the input CLOCK of control circuit 42 for controlling the timing when transmission gate 43 is enabled. The exact implementation of the logic gates of control circuit 42 is not critical. Control circuit 42 provides control signals for enabling an appropriate transmission gate for maintaining the predetermined RC time constant to meet performance goals.

An alternate approach for generating different capacitance values from a variable capacitor is to enable more than one capacitor simultaneously thereby coupling more than one capacitor of the variable capacitor in parallel to generate a specific capacitance value. A transmission gate (or more than one transmission gate) is enabled to approximate a predetermined RC time constant to charge and discharge the specific capacitance value.

In general, a variable capacitor has more than three capacitors (as shown in FIG. 3). An equal number of transmission gates to capacitors may not be feasible if a variable capacitor comprises a large number of capacitors. A logical alternative is to reduce the number of transmission gates and to use each transmission gate over a small range of capacitance values. Although a slight compromise on accuracy and voltage error is made to reduce circuit area and complexity, it is still significantly better than using a single transmission gate over the entire capacitance range of a variable capacitor.

An alternate method for reducing the number of transmission gates is to enable more than one transmission gate to produce a change in resistance. For example, a small number of transmission gates are optimized for different capacitor ranges of a variable capacitor. Instead of a single transmission gate being enabled, more than one transmission gate is coupled in parallel to produce a resistance for a specific capacitor value that better approximates the predetermined RC time constant selected.

By now it should be appreciated that a circuit and method has been provided that reduces voltage error and increases performance when charging and discharging a variable capacitor through a transmission gate. The circuit comprises a transmission gate formed by a plurality of transmission gates coupled in parallel. A transmission gate of the plurality of transmission gates is enabled by a control circuit for coupling to a capacitor of the variable capacitor. The control circuit enables the transmission gate having a resistance that approximates a predetermined RC time constant that meets speed and accuracy requirements of the circuit. Each transmission gate has a charge negating transmission gate coupled thereto for reducing voltage error due to parasitic capacitance and channel charge of the enabled transmission gate.

The method for charging and discharging a variable capacitor through transmission gate includes varying (or changing) a resistance of the transmission gate coupled to the variable capacitor such that a predetermined RC time constant is maintained for each capacitance value of the variable capacitor.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A circuit for reducing voltage error when charging and discharging a variable capacitor, the circuit comprising:

a plurality of transmission gates coupled in parallel forming a switch, said switch is coupled to the variable capacitor for coupling a voltage thereto; and a control circuit for providing a control signal to each transmission gate of said plurality of transmission gates, said control circuit enables and disables transmission gates of said switch for changing a resistance of said switch to maintain a predetermined RC time constant as a capacitance of the variable capacitor is changed.

2. The circuit as recited in claim 1 wherein one transmission gate of said plurality of transmission gates is enabled for each capacitance value of the variable capacitor.

3. The circuit as recited in claim 2 wherein each transmission gate of said plurality of transmission gates has a different resistive value when enabled.

4. The circuit as recited in claim 1 wherein more than one transmission gate of said plurality of transmission gates is enabled, a combined resistance of said more than one enabled transmission gates and said capacitance of the variable capacitor being approximately equal to said predetermined RC time constant.

5. A method for reducing voltage error when charging and discharging a variable capacitor through a switch, the method comprising: changing a resistive value of the switch to maintain a predetermined RC time constant as a capacitive value of the variable capacitor is changed.

6. A method for reducing voltage error when charging and discharging a variable capacitor through a switch, the method comprising:

forming the switch as a plurality of transmission gates coupled in parallel; and enabling at least one transmission gate of said plurality of transmission gates to maintain a predetermined RC time constant wherein a resistance of said enabled transmission gate and a capacitance value of said variable capacitor approximately equals said predetermined RC time constant.

7. The method as recited in claim 6 wherein the step of forming the switch as a plurality of transmission gates includes the step of:

forming the switch as a plurality of transmission gates in parallel wherein each transmission gate has a different resistive value when enabled.

8. The method as recited in claim 6 wherein the step of forming the switch as a plurality of transmission gates includes the step of:

forming the switch as a plurality of transmission gates in parallel wherein more than one transmission gate is enabled to generate an effective resistance to maintain said predetermined time constant.

* * * * *